United States Patent
Winkler et al.

(10) Patent No.: US 9,431,210 B2
(45) Date of Patent: Aug. 30, 2016

(54) CHARGED PARTICLE BEAM DEVICE WITH DYNAMIC FOCUS AND METHOD OF OPERATING THEREOF

(71) Applicant: ICT Intergrated Circuit Testing Gesellschaft für Halbleiterprüftechnik GmbH, Heimstetten (DE)

(72) Inventors: Dieter Winkler, Munich (DE); Igor Petrov, Holon (IL)

(73) Assignee: ICT Integrated Circuit Testing Gesellschaft fur Halbleiterpruftechnik GmbH, Heimstetten (DE)

( * ) Notice: Subject to any disclaimer, the term of this patent is extended or adjusted under 35 U.S.C. 154(b) by 0 days.

(21) Appl. No.: 14/679,581

(22) Filed: Apr. 6, 2015

(65) Prior Publication Data
US 2015/0213998 A1    Jul. 30, 2015

Related U.S. Application Data (63) Continuation of application No. 13/405,759, filed on Feb. 27, 2012, now abandoned.

(51) Int. Cl.
*H01J 37/145*  (2006.01)
*H01J 37/12*   (2006.01)
(Continued)

(52) U.S. Cl.
CPC .......... *H01J 37/145* (2013.01); *H01J 37/1474* (2013.01); *H01J 37/21* (2013.01); *H01J 37/28* (2013.01); *H01J 2237/28* (2013.01)

(58) Field of Classification Search
CPC .......... H01J 37/10; H01J 37/12; H01J 37/14; H01J 37/141; H01J 37/1413; H01J 37/1416; H01J 37/143; H01J 37/145; H01J 37/26; H01J 37/261; H01J 37/28
USPC .................................................. 250/306–311
See application file for complete search history.

(56) References Cited

U.S. PATENT DOCUMENTS

| 5,895,917 A | * | 4/1999 | Ueda ..................... H01L 37/145 250/310 |
| 6,104,034 A | * | 8/2000 | Frosien ................. H01L 37/145 250/396 ML |

(Continued)

FOREIGN PATENT DOCUMENTS

| EP | 0 790 634 A1 | 8/1997 |
| EP | 0 952 606 A1 | 10/1999 |

OTHER PUBLICATIONS

Jane Golubovskaya; Resistivity of Glass; The Physics Factbook; dated 2004; 2 total pages.
(Continued)

*Primary Examiner* — Jack Berman
*Assistant Examiner* — David E Smith
(74) *Attorney, Agent, or Firm* — Patterson & Sheridan, LLP (57) ABSTRACT

A retarding field scanning electron microscope for imaging a specimen is described. The microscope includes a scanning deflection assembly configured for scanning an electron beam over the specimen, one or more controllers in communication with the scanning deflection assembly for controlling a scanning pattern of the electron beam, and a combined magnetic-electrostatic objection lens configured for focusing the electron beam, wherein the objective lens includes a magnetic lens portion and an electrostatic lens portion. The electrostatic lens portion includes an first electrode configured to be biased to a high potential, and a second electrode disposed between the first electrode and the specimen plane, the second electrode being configured to be biased to a potential lower than the first electrode, wherein the second electrode is configured for providing a retarding field of the retarding field scanning electron microscope. The retarding field scanning electron microscope further includes a voltage supply being connected to the second electrode for biasing the second electrode to a potential and being in communication with the one or more controllers, wherein the one or more controllers synchronize a variation of the potential of the second electrode with the scanning pattern of the electron beam.

11 Claims, 6 Drawing Sheets

(51) Int. Cl.
*H01J 37/28* (2006.01)
*H01J 37/21* (2006.01)
*H01J 37/147* (2006.01)

(56) References Cited

U.S. PATENT DOCUMENTS

| | | | |
|---|---|---|---|
| 6,232,601 B1* | 5/2001 | Schmitt | H01J 37/21 250/310 |
| 6,617,595 B1 | 9/2003 | Okunuki | |
| 2002/0036264 A1 | 3/2002 | Nakasuji et al. | |
| 2003/0209673 A1* | 11/2003 | Ono | H01J 9/14 250/396 R |
| 2004/0119021 A1 | 6/2004 | Parker et al. | |
| 2005/0077475 A1* | 4/2005 | Nagae | B82Y 10/00 250/396 R |
| 2005/0253082 A1 | 11/2005 | Ono et al. | |
| 2006/0049348 A1* | 3/2006 | Petrov | G01N 23/2204 250/307 |
| 2006/0060790 A1 | 3/2006 | Nakasuji et al. | |
| 2006/0076489 A1 | 4/2006 | Ohshima et al. | |
| 2006/0151713 A1 | 7/2006 | Adamec | |
| 2006/0226361 A1* | 10/2006 | Frosien | G01R 31/305 250/310 |
| 2007/0228285 A1* | 10/2007 | Fuse | B82Y 10/00 250/396 R |
| 2009/0200463 A1 | 8/2009 | Degenhardt et al. | |
| 2010/0023082 A1 | 1/2010 | Dong et al. | |
| 2010/0108904 A1* | 5/2010 | Adamec | H01J 37/1471 250/397 |
| 2010/0320382 A1 | 12/2010 | Almogy et al. | |
| 2011/0163229 A1* | 7/2011 | Frosien | H01J 37/05 250/310 |

OTHER PUBLICATIONS

Extended European Search Report for Application No. 12156233.4-2208 dated Aug. 8, 2012; 8 total pages.

* cited by examiner

CHARGED PARTICLE BEAM DEVICE WITH DYNAMIC FOCUS AND METHOD OF OPERATING THEREOF

CROSS-REFERENCE TO RELATED APPLICATIONS

This application is a continuation application of co-pending U.S. patent application Ser. No. 13/405,759, filed on Feb. 27, 2012, which claims the priority benefit of European Patent Application No. 12156233.4, filed Feb. 20, 2012, the contents of which are incorporated by reference herein in their entirety for all intended purposes.

TECHNICAL FIELD OF THE INVENTION

Embodiments of the present invention relate to a retarding field scanning microscope using a charged particle beam and to a method of imaging a specimen by scanning a charged particle beam.

BACKGROUND OF THE INVENTION

Charged particle beam apparatuses have many functions, in a plurality of industrial fields, including, but not limited to, critical dimensioning of semiconductor devices during manufacturing, defect review of semiconductor devices during manufacturing, inspection of semiconductor devices during manufacturing, exposure systems for lithography, detecting devices and testing systems. Thus, there is a high demand for structuring, testing and inspecting specimens within the micrometer and nanometer scale.

Micrometer and nanometer scale process control, inspection or structuring is often done with charged particle beams, e.g. electron beams, which are generated and focused in charged particle beam devices, such as electron microscopes or electron beam pattern generators. Charged particle beams offer superior spatial resolution compared to, e.g. photon beams due to their short wavelengths.

Thereby, some applications require a high resolution, e.g. of 10 nm or below, a large field of view and a high scanning speed. When a charged particle beam such as an electron beam is scanned over a flat surface, it is typically continuously refocused. The focal distance between the lens and the position to be imaged increases when the beam is deflected away from the axis (field curvature correction). In order to allow for high resolution and large field of view, the beam is therefore refocused during deflection. However, the application of a high scanning speed is an additional challenge.

For scanning the beam off the optical axis in order to achieve the required field of view, a magnetic or electrostatic deflector can be used. Additionally, due to the field curvature, correction of the focus length can be used. This has often been done by readjusting the magnetic field of the objective lens and/or by adjusting the beam energy in the objective lens. Another theoretical possibility would be to apply a common voltage to all electrodes in the microscope or to insert an additional electrode and changing potential of these electrodes or the additional electrode. However, it has been found that the latter would necessitate high voltages up to 1 kV for fields of view in the 100 μm area. Such high voltages are difficult to switch with the required speed and furthermore require electrical insulation which is difficult to achieve for these high voltages. Yet further, such electrodes represent relatively large capacitances, which are also difficult to switch quickly.

In view of the above, it is an object of the present invention to provide an improved retarding field scanning microscope using a charged particle beam, particularly an electron beam that would overcome at least some of the above problems.

SUMMARY OF THE INVENTION

In light of the above, a retarding field scanning electron microscope according to independent claim 1, and a method of imaging a specimen according to claim 11, are provided. Further aspects, advantages, and features of the present invention are apparent from the dependent claims, the description and the accompanying drawings.

According to one embodiment, a retarding field scanning electron microscope for imaging a specimen is provided. The microscope includes a scanning deflection assembly configured for scanning an electron beam over the specimen, one or more controllers in communication with the scanning deflection assembly for controlling a scanning pattern of the electron beam, and a combined magnetic-electrostatic objective lens configured for focusing the electron beam, wherein the objective lens includes a magnetic lens portion and an electrostatic lens portion. The electrostatic lens portion includes a first electrode configured to be biased to a high potential, and a second electrode disposed between the first electrode and the specimen plane, the second electrode being configured to be biased to a potential lower than the first electrode, wherein the second electrode is configured for providing a retarding field of the retarding field scanning electron microscope. The retarding field scanning electron microscope further includes a voltage supply being connected to the second electrode for biasing the second electrode to a potential and being in communication with the one or more controllers, wherein the one or more controllers synchronize a variation of the potential of the second electrode with the scanning pattern of the electron beam, According to another embodiment, a method of imaging a specimen is provided. The method includes generating an electron beam in a retarding field scanning electron microscope, scanning the electron beam over a specimen for image generation and focusing the electron beam on the specimen with a combined magnetic-electrostatic objective lens, wherein the objective lens includes a magnetic lens portion and an electrostatic lens portion, and wherein the electrostatic lens portion includes a first electrode and a second electrode disposed between the first electrode and the specimen. The method further includes biasing the second electrode to a varying potential, and synchronizing the variation of the potential of the second electrode with the scanning of the electron beam.

Embodiments are also directed at apparatuses for carrying out the disclosed methods and include apparatus parts for performing each described method step. These method steps may be performed by way of hardware components, a computer programmed by appropriate software, by any combination of the two or in any other manner. Furthermore, embodiments are also directed at methods by which the described apparatus operates. It includes method steps for carrying out every function of the apparatus.

BRIEF DESCRIPTION OF THE DRAWINGS

So that the manner in which the above recited features of the present invention can be understood in detail, a more particular description of the invention, briefly summarized above, may be had by reference to embodiments. The accompanying drawings relate to embodiments of the invention and are described in the following.

DETAILED DESCRIPTION OF EMBODIMENTS

Reference will now be made in detail to the various embodiments of the invention, one or more examples of which are illustrated in the figures. Within the following description of the drawings, the same reference numbers refer to same components. Generally, only the differences with respect to individual embodiments are described. Each example is provided by way of explanation of the invention and is not meant as a limitation of the invention. Further, features illustrated or described as part of one embodiment can be used on or in conjunction with other embodiments to yield yet a further embodiment. It is intended that the description includes such modifications and variations.

Without limiting the scope of protection of the present application, in the following the charged particle beam device or components thereof will exemplarily be referred to as a charged particle beam device including the detection of secondary electrons. The present invention can still be applied for apparatuses and components detecting corpuscles, such as secondary and/or backscattered charged particles in the form of electrons or ions, photons, X-rays or other signals in order to obtain a specimen image. Generally, when referring to corpuscles they are to be understood as light signals in which the corpuscles are photons as well as particles, in which the corpuscles are ions, atoms, electrons or other particles.

A "specimen" as referred to herein, includes, but is not limited to, semiconductor wafers, semiconductor workpieces, and other workpieces such as memory disks and the like. Embodiments of the invention may be applied to any workpiece on which material is deposited or which is structured. A specimen includes a surface to be structured or on which layers are deposited, an edge, and typically a bevel. According to some embodiments, which can be combined with other embodiments described herein, the apparatus and methods are configure for or are applied for critical dimensioning applications and defect review, where the microscopes and methods according to embodiments described herein, can be beneficially used in light of the desires of these applications.

In the context of the here described embodiments, without limiting the scope of protection thereto, an intermediate beam acceleration system intends to describe a charged particle beam apparatus with initial high acceleration of the charged particles, which will be decelerated to a landing energy shortly before striking the specimen. The energy or velocity ratio $v_{ac}/v_{landing}$ between the acceleration velocity $v_{ac}$, at which the charged particles are guided through the column and the landing velocity $v_{landing}$, at which the charged particles strikes the specimen can be about at least 5 or higher. Furthermore, the landing energy can be 2 kV or less. These are approximate values which might be adapted according to circumstances.

Furthermore, in the following description, it is mostly referred to scanning electron beam microscopes (SEM), which can particularly profit from the embodiments described herein. However, there might be special circumstances, where the embodiments can also be applied for ion beam scanning systems, where an image is generated by scanning an ion beam over a specimen.

According to some embodiments described herein, an E-beam inspection, critical dimensioning (CD) tool, and/or defect review (DR) tool can be provided, wherein high resolution, large field of view and high scanning speed can be achieved. The field curvature correction is conducted with a fast focusing or with a fast re-focusing, respectively. Thereby, the decelerating electrode of the immersion lens being part of the objective lens is utilized to re-focus the beam, wherein the potential of the decelerating electrode is synchronized by a controller with the scanning deflection system.

The beam is thereby scanned over an essentially flat surface. It is continuously refocused while the refocusing is synchronized with the scanning of the beam for correction of the field curvature. As the focal distance between lens and specimen plane increases when the beam is deflected away from the axis, the re-focusing is conducted synchronized with the scanning, e.g. scanning of lines, particularly for high scanning speeds, e.g. pixel rates in the GHz region and line speeds in the MHz region.

According to some embodiments, which can be combined with other embodiments described herein, the fast correction of field curvature, i.e. the increased distance between the objective lens and the specimen plane due to scanning deflection of the beam, can be utilized for vector field addressing of the measurement pixels. Thereby, the electron beam is typically not scanned along lines to scan an area of the specimen, but the electron beam is scanned to individual positions or to individual smaller areas. Accordingly, the voltage corrections function can also be an arbitrary function without a predetermined modulation frequency. For example, if individual pixels are addressed randomly, the correction function can include a plurality of steps of any size between zero correction and maximum correction. Thereby, the fast switching is particularly important because the step like functions correspond to very fast response frequencies of the second electrode.

Further, embodiments relate to retarding field microscopes, e.g. low-voltage high-resolution SEM's, where low landing energies of the primary beam (e.g. 2 keV or below such as 1 keV or below) are used to limit the load on the sample and to avoid damage. Thereby, in order to achieve small beam diameters for maximum resolution, the beam is guided through the microscope column at high energies. Accordingly, a scanning electron microscope with intermediate beam acceleration can be used, where the electron beam is extracted from the source and accelerated to a high energy, e.g. 20 kV. In the final objective lens the beam is slowed down to the required low landing energy of e.g. 1 kV.

According to embodiments described herein, the final objective lens for an electron beam system includes a magnetic-electrostatic lens. The latter consists typically of an upper electrode, which lies on a high potential in reference to the primary electrons, and a lower electrode, which lies on a potential close to the sample voltage. These electrodes contribute to focusing, as well as to slowing down the beam to the required low primary beam voltage. This kind of immersion lens allows focusing the beam with minor loss of resolution compared to high beam voltage systems.

Figure 1A:
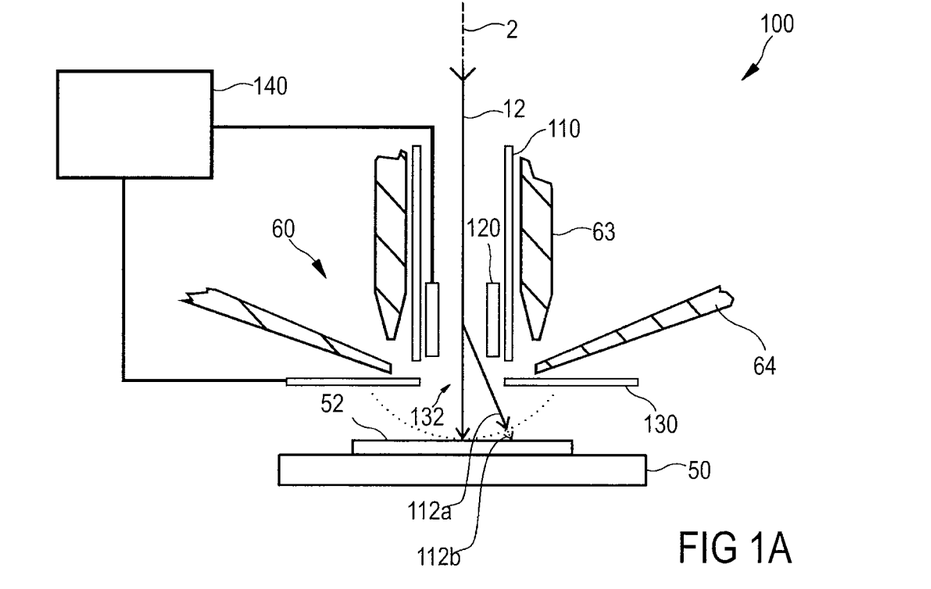
FIGS. 1A and 1B illustrate a schematic partial view of a retarding field scanning charged particle beam device with a synchronization according to embodiments described herein.

FIG. 1A shows a portion of a scanning electron microscope 100. The objective lens 60 includes the magnetic lens portion having an upper pole piece 63, a lower pole piece 64 and a coil (not shown in FIGS. 1A and 1B). The objective lens 60 further includes an electrostatic lens portion having a first electrode 110, i.e. upper electrode in the figures, and a second electrode 130, i.e. lower electrode in the figures.

The objective lens 60 focuses the electron beam 12, which travels in the column along optical axis 2, on the specimen 52, i.e. in a specimen plane. The specimen 52 is supported on a specimen support table 50. According to some embodiments, which can be combined with other embodiments described herein, scanning of an area of the specimen can be conducted by movement of the table in a first direction essentially perpendicular to the optical axis, and by scanning lines in another, second direction essentially perpendicular to the optical axis and essentially perpendicular to the first direction.

If the beam is scanned according to a predetermined scan pattern, e.g. adjacent lines are scanned, the beam travels off the optical axis 2 in order to scan the required field of view. Thereby, a scanning deflector assembly 120 is used. According to different embodiments, the scanning assembly can be electrostatic, magnetic or combined electrostatic-magnetic. Typically, at least one scanning direction essentially perpendicular to the optical axis 2 (e.g. z-direction) is provided. Often two scanning directions (e.g. x-direction and y-direction) and the corresponding scanning assemblies are provided. The one or more scanning deflection assemblies are thereby configured for high speed scanning, e.g. to achieve a pixel rate in the GHz region (e.g. 3 GHz or above) and/or a line rate in the MHz region (e.g. 3 MHz or above).

Additionally, due to field curvature, correction of the focus length is required as illustrated by the focus points 112a and 112b in FIG. 1A. According to embodiments described herein, the field curvature is corrected continuously during scan, i.e. in a synchronized manner with the scanning pattern. For modern, high throughput systems, which can be of MHz per line for modern systems with pixel acquisition rates in the GHz region, correction of the field curvature is challenging and the correction voltage and/or the capacity or induction of correction elements has to be considered.

In light of the above, embodiments described herein use the second (lower) electrode 130 for re-focusing in a synchronized manner with the scanning. The second electrode can be on ground potential or on a potential relatively close to the sample potential for focusing in a position on the optical axis. As the beam velocity is already slow when the beam passes this electrode, already small variations of its potential lead to a sufficiently large change of focusing properties. A 100 μm field of view would thus require a dynamic focus voltage of a few volts only. According to embodiments, typical correction voltages can be in the range of 0.1 V to 50 V, e.g. about 5 V for a maximum value of a full ±50 μm scan deflection. The small voltages are easier to switch at high speeds. Furthermore, it is easier to design this electrode to have a small capacitance, as it is located outside the lens structure and can be reduced and/or adjusted in capacitance as described in more detail below. Thereby, exemplarily a 100 μm field of view is understood as a field of view having a scanning range in at least one direction of ±50 μm, typically of ±50 μm in two directions such that a 100 μm×100 μm square is measured. It can be understood that the diagonal of such square or rectangle (in case of one direction) is larger than 100 μm.

According to embodiments described herein, the scan deflection assembly 120 and the second electrode 130 are connected to a controller 140 or a controller assembly, wherein a synchronization of the focus correction is conducted. For example, a beam position on the optical axis would correlate with no correction voltage, whereas a maximum deflection of the electron beam 12 to the left and right in FIG. 1A would correlate to a maximum voltage correction of a few volts. For example, a scanning line frequency of 10 MHz would result in a variation of the potential of the second electrode 130 with a corresponding frequency. In embodiments described herein, the focus correction signal is delivered to the voltage driver of the lower electrode.

Figure 1B:
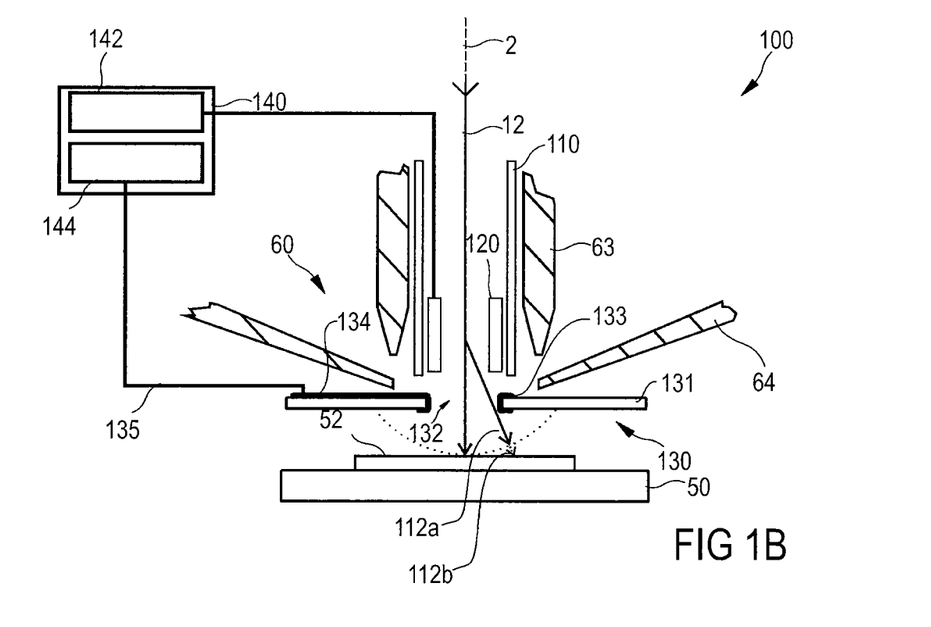

FIG. 1B shows another scanning electron microscope according to some embodiments described herein. As compared to FIG. 1A, the controller 140 or controller assembly includes controllers 142 and 144. The controller 142 drives and/or controls the scanning deflector and the controller 144 drives/controls the correction potential applied to the second electrode 130. The controllers 142 and 144 form a portion of the controller 140, which provides synchronization. Accordingly, more than one controller can be provided to synchronize the focus correction potential applied to the second electrode 130 with the scanning pattern of the electron beam.

According to yet further embodiments, which can be combined with other embodiments described herein, the second electrode can be provided by a body 131, and an electrode unit 133 provided on the body. Thereby, the capacitance can be further reduced to improve the capability to correct in a synchronized manner with the high speed scanning.

According to typically embodiments, the electrode unit can be provided on an electrically non-conductive body or a body having a small electrical conductivity in order to reduce the size of the electrically conductive portion and, thus, the capacitance.

Figure 2A:
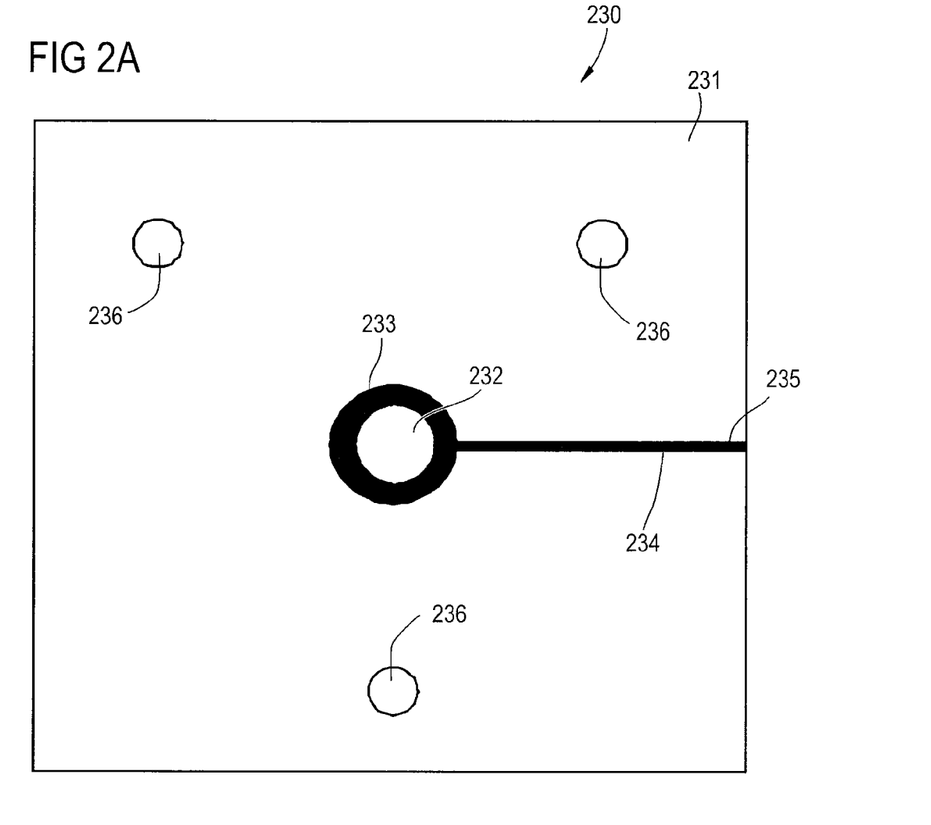
FIG. 2A illustrates a schematic view of an optionally used electrode of an immersion lens of a retarding field scanning charged particle beam device with a synchronization according to embodiments described herein.
Figure 2B:
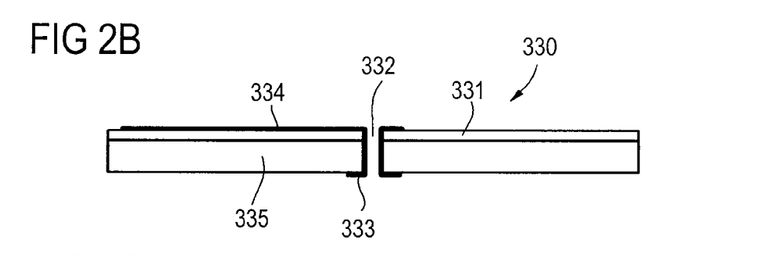
FIG. 2B illustrates a schematic view of an optionally used electrode of an immersion lens of a retarding field scanning charged particle beam device according to embodiments described herein.

As illustrated in FIGS. 2A and 2B, the electrode unit 133 can surround the through hole 132 in the body 131. Electrode unit 133 can be arranged on the surface of the body 131, e.g. a ceramic body, which faces, when in use, the specimen. In further embodiments, electrode unit 133 is arranged on the opposite surface of ceramic body 131. The function of electrode unit 133 will be described in detail further below.

In yet other embodiments, the electrode 130 can also include an electrical connection 134 and 135 for connecting the electrode unit 133 and, optionally also a conductive ceramic body 131 with one or more voltage supplies. The electrode unit 133 can have a lower specific electrical resistivity than the ceramic body 131. This allows for fast switching of the electrode. According to some embodiments, ceramic body 131 and electrode 133 can be separately connected to different voltage supplies.

According to embodiments described herein, the second electrode can be provided by a body and an electrode unit. Thereby, the capacitance of the electrode 130 can be further reduced to allow for fast switching of the electrode in a manner synchronized with the fast scanning.

According to some other embodiments, which can be combined with other embodiments described herein, the electrode 130 does not include an electrode unit 133. Instead, a conductive ceramic 131 can be electrically connected to the voltage supply for biasing the electrode 130.

According to an embodiment, electrode 133 is insulated from ceramic body 131. This allows providing ceramic body 131 and electrode 133 with independent voltage supplies. According to other embodiments, which can be combined with other embodiments described herein, electrode unit 133 is in electrical connection with the ceramic body 131. Electrode unit 133 including its electrical connection line 134 can be formed directly on the ceramic body 134. Therefore, only one electrical terminal is needed to connect both the electrode unit 133 and the ceramic body 131. Typically, electrode unit 133 is connected through connection line 134 with a terminal formed on ceramic body 131. Since connection line 134 and electrode unit 133 are in electrical contact with ceramic body 131, ceramic body 131 will also be on the same electrical potential as electrode unit 133. The direct electrical connection between electrode unit 133 and ceramic body 131 does not significantly influence switching behavior of the electrode unit 133 since ceramic body 131 has a significantly higher resistivity than electrode unit 133. Hence, fast switching of electrode unit 133 does not affect the electrical potential of ceramic body 131, which will be substantially constant. This also means that the decelerating and re-focusing effect of electrode 130 remains effective during switching of the electrode unit 133.

The above described low-pass capability of ceramic body 131 can be understood when considering the ceramic body as large capacity, which is connected to electrode unit 133 through a large resistor formed by the conductive ceramic material of ceramic body 131.

FIG. 2A illustrates an embodiment of an electrode 230 having a ceramic body 231, a through hole 232, an electrode unit 233, a terminal 235, and a connection line 234, which electrically connects terminal 235 with electrode unit 233. As illustrated in FIG. 2A, electrode unit 233 can be formed on both sides of ceramic body 231. Furthermore, electrode unit 233 is axially centered around through hole 232. Typically, electrode unit 233 has a rotationally-symmetric shape with respect to the axis of through hole 232.

Electrode unit 233 extends through the through hole 232 and covers the sidewalls of through hole 232. Electrode unit 233 and connection line 234 are formed by a metal, which is deposited directly onto ceramic body 231 so that they are in electrical contact. According to embodiments, electrical connection line 234 can also be partially or completely electrically insulated from ceramic body 231. This reduces the contact area and increases the resistance between electrode unit 233 and ceramic body 231. By so doing, the low-pass characteristic of the ceramic body is improved. The contact area between electrode unit 233 and electrical connection line 234 and ceramic body 231 can be adapted to tailor the electrical behavior of electrode 230.

Electrode 230 is furthermore adapted to be held by holders which keeps electrode 230 in a predefined position with respect to the column. The holders also electrically insulate the electrode 230 against the column. The holders can be, for example, fixed to the electrode 230 by a screw joint, wherein the holders are screwed in to an internal thread 236.

Referring back to FIG. 2A, electrode 230 can be manufactured, for example by providing a conductive ceramic body 231 and forming the through hole 232 in the ceramic body 231 so that the through hole 232 extends through the ceramic body 231. Through hole 232 can be formed when ceramic body 231 is provided as green body. Before or after firing the green ceramic body, electrode unit 233 surrounding the through hole 232 and connection line 234 in electrical connection with the electrode unit 233 are formed. The material of electrode unit 232 is chosen to have a lower specific electrical resistivity than the fired ceramic body 231. Electrode unit 233 and connection line 234 can be a metal coating.

According to an embodiment, electrode unit 233 and/or connection line 234 can be formed by vapor deposition. According to an embodiment, electrode unit 233 can be a metal ring or a preformed metal electrode which is inserted into through hole 232. In this case, through hole 232 in ceramic body 131 can be made larger, for example up to 20 mm, to provide sufficient space for the metal ring. The actual through hole for the charged particles are then defined by the aperture of the ring.

According to an embodiment, which can be combined with other embodiments described herein, an electrode 330, as illustrated in FIG. 2B, includes a carrier 335 comprised of an insulating material and a conductive substrate 331 which at least partially covers portions of carrier 335. Conductive substrate 331 can be comprised of a material having a specific electrical resistivity in a range from about $10^6$ Ωcm to about $10^{12}$ Ωcm. Examples thereof are conductive ceramics such as SiC and doped aluminum oxide and diamond-like carbon (DLC). Carrier 335 is electrically insulating. A through hole 332 is provided in the conductive substrate 331 and carrier 335. Substrate 331 can be formed on carrier 335, for example, by deposition or pasting.

According to an embodiment, electrode 330 includes an electrode unit 333 which can be comprised of, for example, metal. An electrical connection 334 can be provided to contact electrode unit 333 and conductive substrate 331.

Figure 2C:
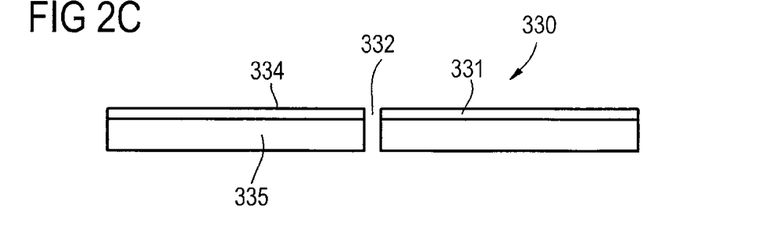
FIG. 2C illustrates a schematic view of an optionally used electrode of an immersion lens of a retarding field scanning charged particle beam device according to embodiments described herein.

According to an embodiment, as illustrated in FIG. 2C, electrode 330 does not include a separate electrode unit, but uses the conductive ceramic as the electrode.

Figure 3:
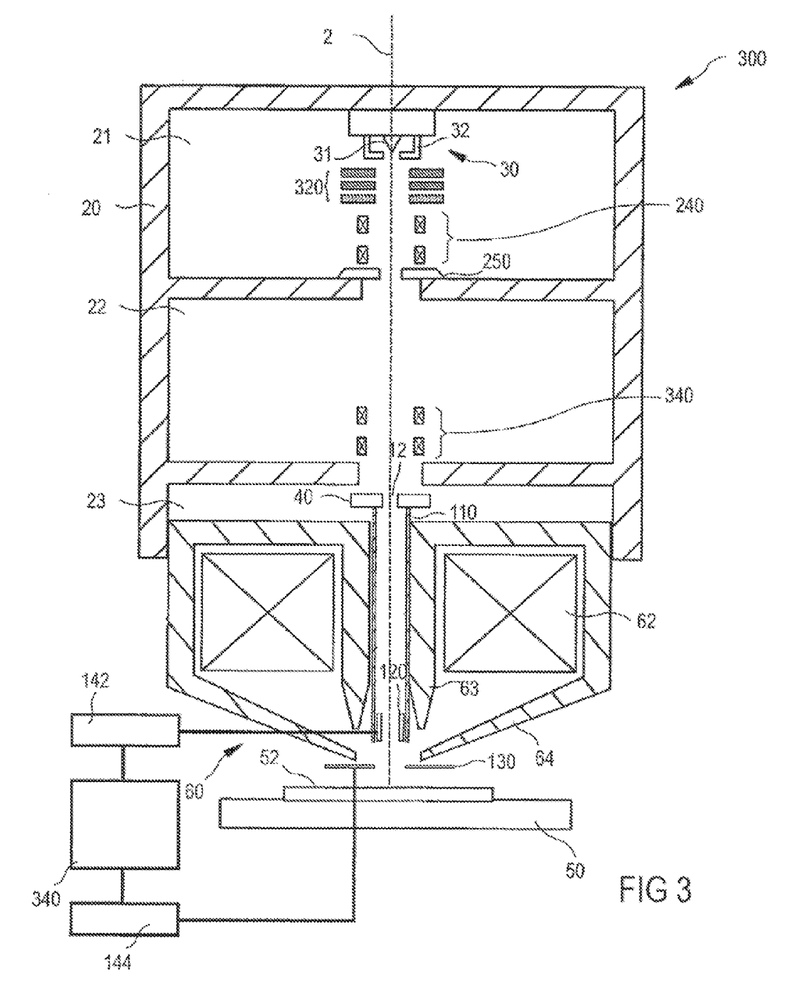
FIG. 3 illustrates a schematic view of a retarding field scanning charged particle beam device according to embodiments described herein.

Further embodiments can be described with respect to FIG. 3. FIG. 3 shows a charged particle beam device 300. The charged particle beam column 20 provides a first chamber 21, a second chamber 22 and a third chamber 23. The first chamber, which can also be referred to as a gun chamber, includes the charged particle source 30 having an emitter 31 and suppressor 32. A charged particle beam is generated by the charged particle beam source 30, is aligned to the beam limiting aperture 250, which is dimensioned to shape the beam, i.e. blocks a portion of the beam, passes through opening 12 of the detector 40 and is focused on the specimen 52 positioned on a specimen position on the specimen stage 50. On impingement of the charged particle beam, for example, secondary or backscattered electrons are released from the specimen 50, which can be detected by the detector 40.

According to some embodiments, which can be combined with other embodiments described herein, a condenser lens 320 and a beam shaping or beam limiting aperture 250 is provided. The two-stage deflection system 240 is provided between the condenser lens and the beam shaping aperture 250 for alignment of the beam to the aperture.

As shown in FIG. 3, according to some embodiments, a detector 40 can be provided above the objective lens such that the primary charged particle beam passes through the opening 12 in the detector. The objective lens 60 having pole pieces 64/63 and a coil 62 focuses the charged particle beam on a specimen 52, which can be positioned on a specimen stage 50. The objective lens 60 shown in FIG. 3 includes the upper pole piece 63, the lower pole piece 64 and the coil 62 forming a magnetic lens portion of the objective lens, as well as the first (upper) electrode 110 and the second (lower) electrode 130 forming an electrostatic portion of the objective lens.

Further, a scanning deflector assembly 120 is provided. The scanning deflector assembly is connected to controller 142 and the electrode 130 is connected to controller and/or corresponding voltage supply 144. The controller 142 and the controller/voltage supply 144 is connected to a yet another controller 340, which achieves synchronization between the scanning pattern of scanning the electron beam and the biasing potential of the electrode 130. Thereby, a field curvature for a large field of view can be corrected for, even for high speed scanning applications, because a comparable small voltage adjustment at a low capacitance component can be achieved.

In FIG. 3 the upper electrode 110 of the electrostatic immersion lens is provided in the form of a tube, and the upper electrode 110 has a linear cross-section as shown. As explained above, for an objective lens, when imaging negative charged particles, this tube is preferably on positive potential above three kV, e.g. 10 keV, 15 keV or 20 keV. Thereby, a beam boost potential is provided, i.e. the beam travels with high energy through the column. The embodiment of FIG. 3 shows a lower electrode 130 below the lower pole piece 64, and the lower electrode 130 has a linear cross-section. The lower electrode being the deceleration electrode of the immersion lens component of the objective lens is typically at a potential (without correction) to provide a landing energy of the charged particles on the specimen of 2 keV or below, e.g. 500 V or 1 keV.

Figure 4:
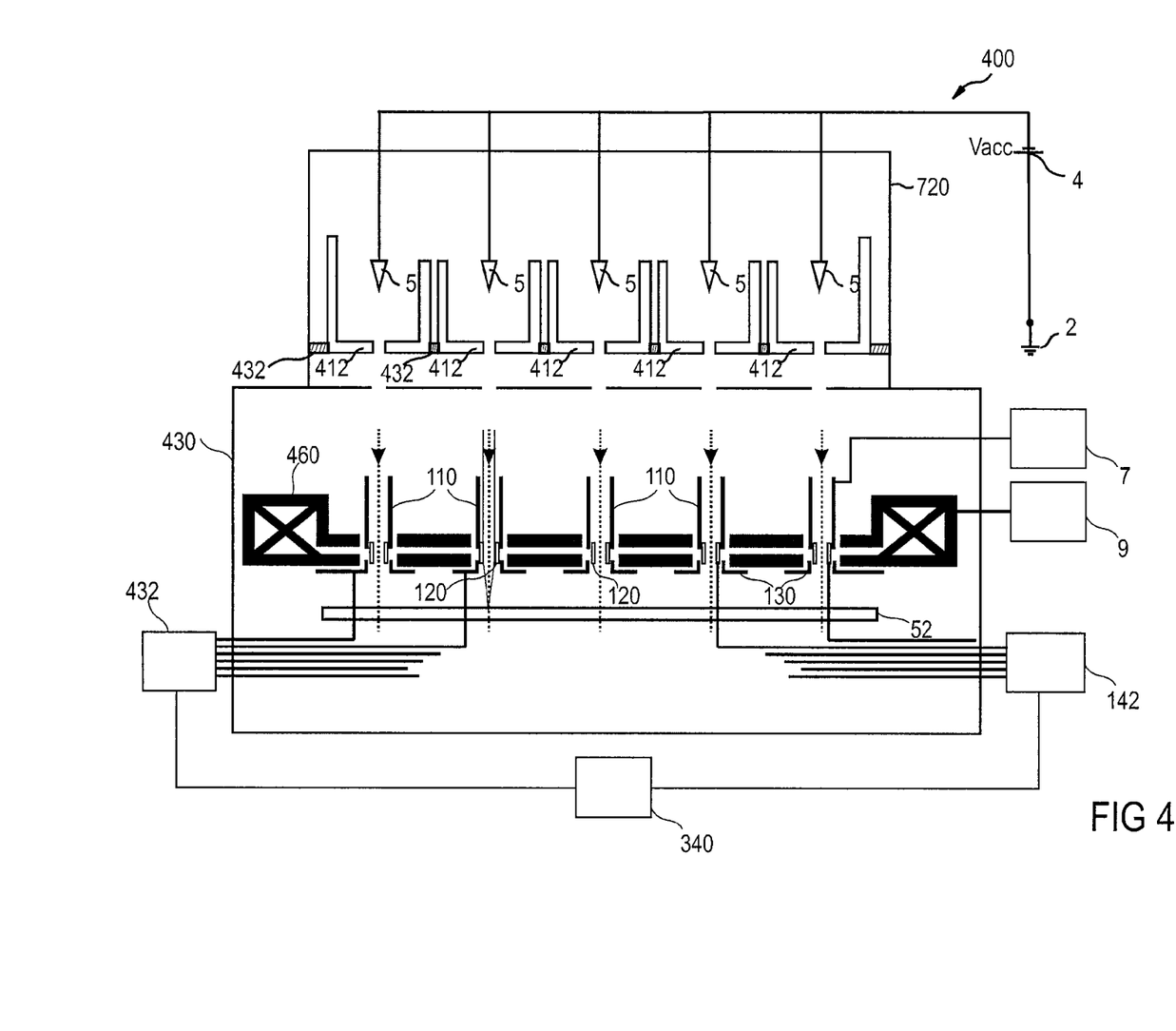
FIG. 4 illustrates a schematic view of a retarding field scanning charged particle beam device having two or more beams according to embodiments described herein.

FIG. 4 illustrates yet further embodiments, wherein the retarding field scanning microscope 400 is provided as a multi-beam device. Typically two or more beams can be provided in a multi-beam device. As an example, FIG. 4 shows five emitters 5 such that 5 electron beams are emitted in the gun chamber 420. The emitter tips are biased to an acceleration potential $V_{acc}$ by voltage supply 4, which provides a potential to the tips as compared to ground 2. Electrodes 412, e.g. suppressors, extractors or anodes are provided, e.g. in a cup-like shape. These electrodes are electrically insulated by insulators 432 with respect to each other and with respect to the gun chamber 420. According to some embodiments, which can be combined with other embodiments described herein, also two or more of the electrodes selected from the group consisting of suppressor, extractor, and anode can be provided. Typically, these electrodes 412 are biased to potentials by voltage supplies (not shown) in order to control the two or more electron beams.

The charged particle beams travel in a further chamber 430, in which a specimen 52 is provided. The objective lens 460 focuses the beams on the specimen or in a specimen plane, respectively. Thereby, the objective lens can have a common magnetic lens portion, i.e. a magnetic lens portion acting on two or more of the charged particle beams. Thereby, for example, one common excitation coil is provided to a pole piece unit or a pole piece assembly, wherein several openings for passing of the two or more electron beams through the pole piece unit are provided. The one common excitation coil excited the pole piece unit, such that for example one beam is focused per opening.

As shown in FIG. 4, the objective lens 460 further includes an electrostatic lens portion. For example, an electrostatic lens portion has a first electrode 110 and a second electrode 130. For example, the second electrodes 130 can individually be connected to a controller 144 or a respective power supply being controlled by a controller such that the potentials provided to the electrodes 130 can be synchronized with the scanning deflection of the scanning deflector assemblies 120, which act on the corresponding charged particle beams. The scanning deflector assemblies are controlled by scanning controller 142, which controls the scanning pattern of the deflectors. The controller 340 is connected to the controller/voltage supply 144 for the retarding electrodes 130 and the scan controller 142, such that synchronization is provided.

As shown in FIG. 4, the electrodes 412, optionally the first electrodes 110, the second electrodes 130 and the scanning assemblies 120, are provided individually for the two or more electron beams. However, it can be understood that if a common scanning motion of the two or more beams is provided either by a common scanning deflection assembly or by a common scanning control signal, the second electrode 130 can also be provided as a common electrode, while the re-focusing for field curvature correction is provided for high speed scanning. Yet further, according to some embodiments, which can be combined with other embodiments described herein, one or more of the components, which have been described as individual components above, can be provided as a common component for the two or more charged particle beams. According to yet further embodiments, which can be combined with other embodiments described herein, the two or more beams can also be provided by having two or more columns 20 (as shown, e.g., in FIG. 3) arranged next to each other.

In FIG. 4, lower electrodes 130 are provided such that the potential for focusing each electron beam can be adjusted individually. Thereby, one solution might be to provide a common potential to all lower electrodes 130 or sub-areas of one electrode 130. Additionally, controller 144 provides a correction potential to the sub areas or the electrodes, respectively. For the realization of this embodiment, it is required to have a sufficient resistance between the individual (sub-)electrodes 130. Under this condition, individual correction potentials can be applied. Alternatively, it is possible to have completely independent electrodes 130. Using electrically disconnected electrodes, controller 144 provides an individual potential for each electrode. Thus, controller 144 might be used as a controller for correction purposes and as a controller for providing each electrode with an individual potential.

Figure 5A:
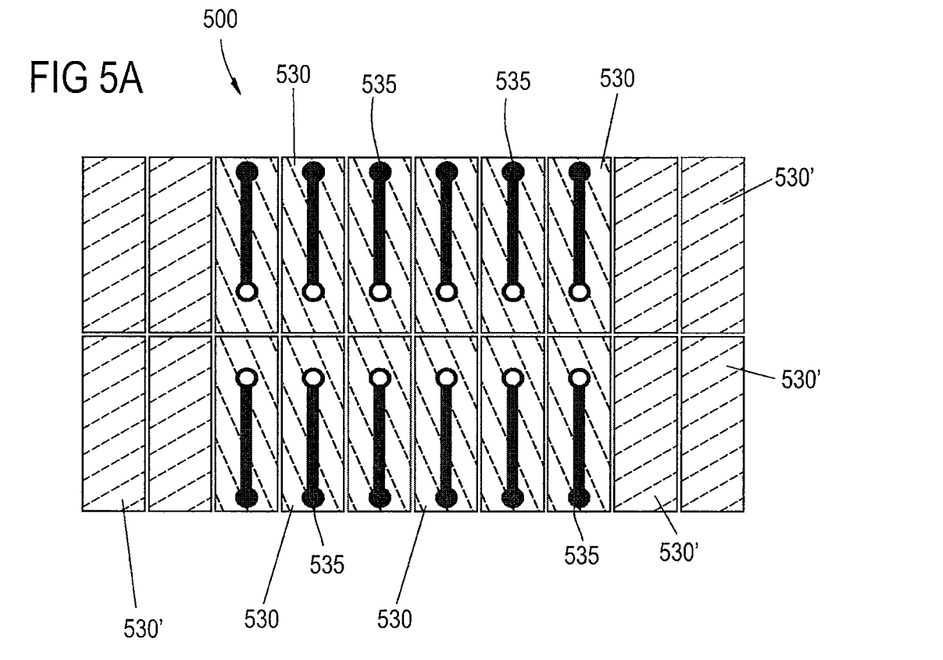
FIGS. 5A and 5B illustrate schematic views of an optionally used electrode of an immersion lens for a retarding field scanning charged particle beam device having two or more beams according to embodiments described herein.
Figure 5B:
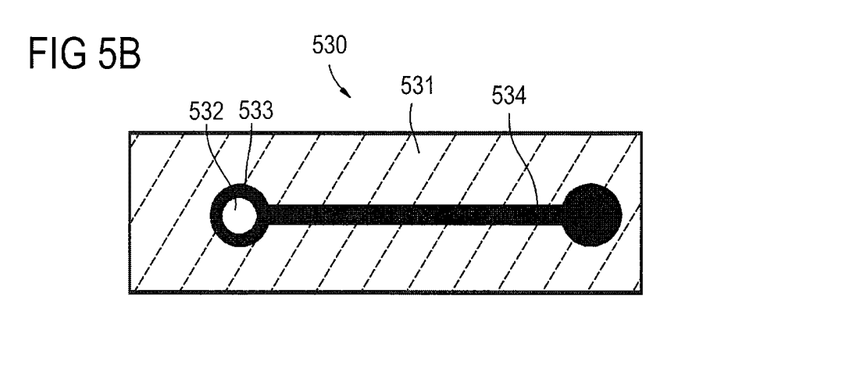

According to some embodiments, the second electrodes 130 for a multi-beam, device can be provided as explained in more detail with respect to FIGS. 5A and 5B. FIGS. 5A and 5B illustrate electrodes according to an embodiment which can be combined with other embodiments described herein. Electrode assembly 500 includes a plurality of individual electrodes 530, one of them is illustrated in an enlarged view in FIG. 5B. Each electrode 530 can be designed as described in connection with FIGS. 2A to 2C.

The electrodes 530 are arranged in two rows in this embodiment so that the connection lines 534 are arranged parallel to each other. The sides on which the through holes 532 are formed are positioned towards each other as illustrated in FIG. 5A. A skilled person will appreciate that other arrangements are also possible. Each electrode 530 can be positioned and aligned individually with respect to the respective column of a multi-column charged particle beam apparatus. Each electrode 530, particularly the through hole 532 of each electrode 530, is centered and aligned with respect to the respectively assigned column so that for each column an individual electrode 530 is provided. In further embodiments, electrodes 530 can be arranged in one row, three or more rows. In yet other embodiments, four electrodes 530 can be provided with terminals extending to all sides of the electrode assembly.

Each electrode 530 includes a ceramic body 531, for example as described above. Since the main component of electrode 530 is the ceramic body 531, electrode 530 can also be referred to as ceramic tile. The thickness of ceramic body 531 can be about 1 mm. The spacing between adjacent electrodes 530 can be about 1 mm. A skilled person will appreciate that these values are only exemplary values and that the dimensions of ceramic body 531 can be adapted according to specific needs.

The ceramic body 531 can be comprised of, for example SiC. Other conductive ceramic materials can also be used. Electrode unit 533 including connection line 534 can be a metal coating which is directly formed on ceramic body 531 to be in electrical contact with ceramic body 531. For example, Ti can be used as metal for forming electrode unit 533 and connection line 534.

A terminal in electrical connection with connection line 534 can be arranged on the side of ceramic body 531 which faces the column. Connection lines 534 can be formed on the side facing the stage. This situation is illustrated in FIGS. 5A and 5B. Terminals are provided to connect the electrode units 533 of each electrode 530 with a voltage supply. Each electrode unit 533 and hence each electrode 530 can be individually connected. This allows for individual switching of the electrode units 533 independently of the other electrode units 533. Each electrode unit 533 can therefore be connected with a separate voltage supply. According to embodiments, which can be combined with other embodiments described herein, each electrode unit 533 is connected to a common voltage supply through a switching unit which is adapted to individually and independently connect the electrode units 533 with the voltage supply. The voltage supply is adapted to provide a potential being controlled to re-focus the beam in a manner synchronized with the scanning of the beam.

Electrode assembly 500 can also include dummy electrodes 530' which are electrically connected to any voltage supply supplying the bias voltage $V_{bias}$ but which, unlike electrodes 530, do not include electrode units to protect the sample from arcing from the outer areas of the column or columns set up The embodiments described herein, may as well include additional components (not shown) such as condenser lenses, deflectors of the electrostatic, magnetic or compound electrostatic-magnetic type, such as Wien filters, scanning deflectors of the electrostatic, magnetic or compound electrostatic-magnetic type, stigmators of the electrostatic, magnetic or compound electrostatic-magnetic type, further lenses of the electrostatic, magnetic or compound electrostatic-magnetic type, and/or other optical components for influencing and/or correcting the beam of primary and/or secondary charged particles, such as deflectors or apertures. Indeed, for illustration purposes, some of those components are shown in the figures described herein. It is to be understood that one or more of such components can also be applied in embodiments of the invention.

Figure 6:
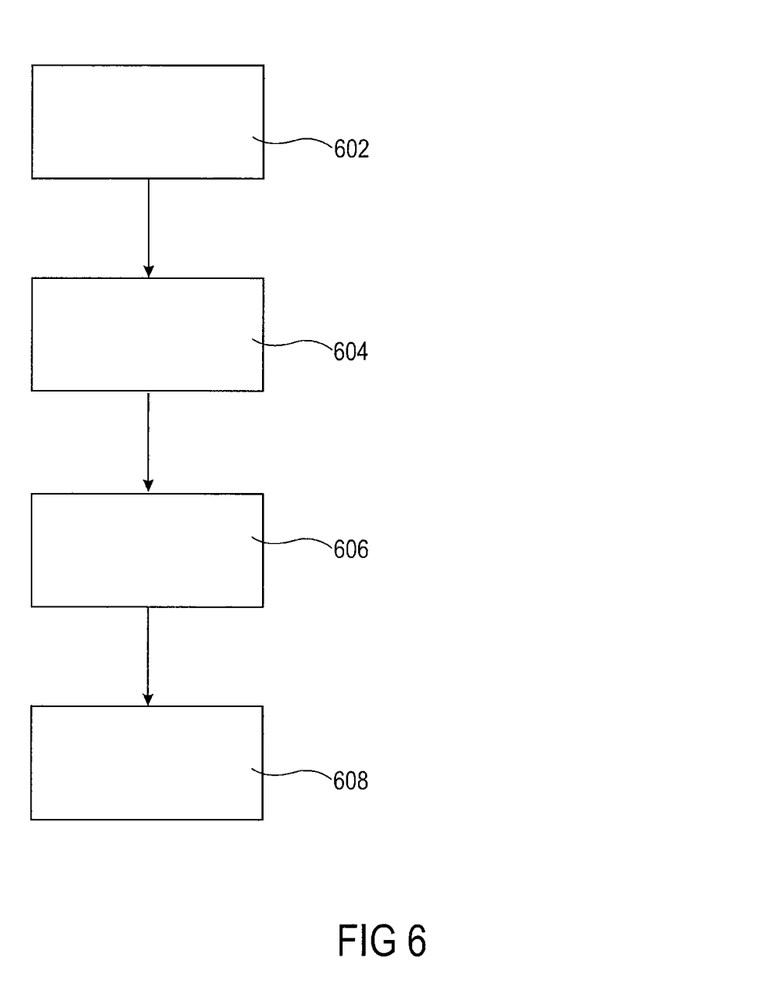
FIG. 6 illustrates a method of operating a retarding field scanning charged particle beam device according to embodiments described herein.

According to some embodiments, a method of imaging a specimen is provided as illustrated in FIG. 6. Thereby, particularly a retarding field scanning microscope is utilized, wherein a charged particle beam, e.g. an electron beam is used. In step 602 a charged particle beam, preferably an electron beam, is generated in the retarding field scanning microscope. In step 604 the beam is scanned over the specimen for image generation. As described above, this can be done in a high speed scanning pattern, where a pixel rate in the GHz range and/or a line rate in the MHz rate are provided. The charged particle beam is focused on the specimen with a combined magnetic-electrostatic objective lens in step 606. The objective lens includes a magnetic lens portion and an electrostatic lens portion, and wherein the electrostatic lens portion includes a first electrode and a second electrode disposed between the first electrode and the specimen. Typically, the second electrode decelerates the charged particles for impingement on the specimen, i.e. an immersion lens is provided by the first and the second electrode. Accordingly, the second electrode is biased to a potential. In order to correct for the field curvature, particularly for a large field of view, the potential provided to the second electrode is varied and the variation is synchronized with the scanning of the electron beam in step 608.

According to yet further embodiments, which can be combined with other embodiments described herein, the re-focusing due to a varying potential provided to the retarding electrode of the immersion lens component of the objective lens can particularly be provided for a scanning being conducted with a pixel rate of 1 GHz or above, particularly with a pixel rate of 3 GHz to 50 GHz. Yet further, the scanning can additionally or alternatively be conducted over a field of view of 50 µm or above, particularly of 50 µm to 500 µm. Thereby, the embodiments can be applied for a retarding field microscope, wherein the electron beam is decelerated by the first and second electrode such that the beam energy is reduced by a factor of 5 or more, particularly by a factor of 10 or more.

While the foregoing is directed to embodiments of the invention, other and further embodiments of the invention may be devised without departing from the basic scope thereof, and the scope thereof is determined by the claims that follow.

The invention claimed is:
1. A retarding field scanning electron microscope, comprising:
 an objective lens comprising:
  a magnetic lens portion, wherein the magnetic lens portion includes an upper pole piece and a lower pole piece; and
  an electrostatic lens portion, wherein the electrostatic lens portion includes a first electrode having a linear cross-section and a second electrode having an linear cross-section, wherein the second electrode is disposed below the lower pole piece of the magnetic lens portion, wherein the first electrode has a longitudinal axis that is substantially perpendicular to a longitudinal axis of the second electrode, and wherein the second electrode comprises;
   a carrier
   a conductive substrate disposed on the carrier, wherein the conductive substrate comprises a material having a specific electrical resistivity in a range from about $10^6$ Ωcm to about $10^{12}$ Ωcm, and wherein a through hole is formed in the carrier and the conductive substrate; and an electrode unit formed in the through hole and on the conductive substrate, wherein the electrode unit is in contact with the conductive substrate and the carrier.

2. The retarding field scanning electron microscope of claim 1, further comprising a scanning deflector assembly, wherein the scanning deflector assembly is disposed inside of the first electrode of the electrostatic lens portion.

3. The retarding field scanning electron microscope of claim 1, further comprising a charged particle beam column, wherein the charged particle beam column includes a first chamber, a second chamber, and a third chamber, and wherein the objective lens is disposed in the third chamber.

4. The retarding field scanning electron microscope of claim 3, further comprising an emitter, a condenser lens, an aperture, and a deflection system disposed between the condenser lens and the aperture.

5. The retarding field scanning electron microscope of claim 4, wherein the emitter, the condenser lens, the aperture, and the deflection system are disposed in the first chamber of the charged particle beam column.

6. The retarding field scanning electron microscope of claim 1, wherein the electrode unit is made of a material having a lower electrical resistivity than an electrical resistivity of the conductive substrate.

7. The retarding field scanning electron microscope of claim 2, further comprising a controller connected to the second electrode of the electrostatic portion and the scanning deflector assembly.

8. A retarding field scanning electron microscope, comprising:

a charged particle beam column;

an objective lens disposed in the charged particle beam column, wherein the objective lens comprises:

a magnetic lens portion, wherein the magnetic lens portion includes at least one pole piece; and an electrostatic lens portion, wherein the electrostatic lens portion includes a first electrode having a linear cross-section and a second electrode having an linear cross-section, wherein the second electrode is disposed below at least one pole piece of the magnetic lens portion, wherein the first electrode has a longitudinal axis that is substantially perpendicular to a longitudinal axis of the second electrode, and wherein the second electrode comprises;

a carrier;

a conductive substrate disposed on the carrier, wherein the conductive substrate comprises a material having a specific electrical resistivity in a range from about $10^6$ Ωcm to about $10^{12}$ Ωcm, and wherein a through hole is formed in the carrier and the conductive substrate; and an electrode unit formed in the through hole and on the conductive substrate, wherein the electrode unit is in contact with the conductive substrate and the carrier; and a scanning deflector assembly, wherein the scanning deflector assembly is disposed inside of the first electrode of the electrostatic lens portion.

9. The retarding field scanning electron microscope of claim 8, wherein the charged particle beam column includes a first chamber, a second chamber, and a third chamber.

10. The retarding field scanning electron microscope of claim 9, further comprising an emitter, a condenser lens, an aperture, and a deflection system disposed between the condenser lens and the aperture, wherein the emitter, the condenser lens and the deflection system are disposed in the first chamber of the charged particle beam column.

11. The retarding field scanning electron microscope of claim 8, wherein the electrode unit is made of a material having a lower electrical resistivity than an electrical resistivity of the conductive substrate.

* * * * *